United States Patent [19]

Jarnagin

[11] Patent Number: 4,607,132

[45] Date of Patent: Aug. 19, 1986

[54] INTEGRATED PV-THERMAL PANEL AND PROCESS FOR PRODUCTION

[76] Inventor: William S. Jarnagin, P.O. Box 127, Concord, Mass. 01742

[21] Appl. No.: 765,069

[22] Filed: Aug. 13, 1985

[51] Int. Cl.$^4$ .................... H01L 31/06; H01L 31/18
[52] U.S. Cl. .................... 136/248; 136/258; 136/261; 29/572; 148/1.5; 427/74; 427/86
[58] Field of Search ............. 136/248, 258 PC, 261; 29/572; 427/74, 86; 148/1.5, 174

[56] References Cited

U.S. PATENT DOCUMENTS 3,914,856 10/1975 Fang ........................ 29/572
4,493,940 1/1985 Takaoka .................... 136/248

Primary Examiner—Aaron Weisstuch

[57] ABSTRACT

This invention relates to producing electricity and heat by means of a hybrid solar panel. Some of the energy (about 10%) is taken off electrically at the top. The rest goes through as infrared heat to an exchange fluid below. The invention includes a means of producing photovoltaic (not just photoconductive) surfaces continuously on copper sheet substrates, without pulling or cutting conventional crystalline boules or ribbons. Significant time, labor, and cost may be saved.

2 Claims, 4 Drawing Figures

INTEGRATED PV-THERMAL PANEL AND PROCESS FOR PRODUCTION

BACKGROUND

Payback time for conventional photovoltaic (PV) cells is about 100 years, for production of domestic electricity. Whereas, payback time for solar heated water panels may be one tenth as much or less. This disparity in cost comes from the different ways the respective energy absorbing surfaces are processed. It is relatively easy to spray or electroplate a copper sheet, as is done on solar heated water panels. But, as this inventor knows from personal experience, much time and many meticulous steps are required in making PV devices. Among these steps are orienting starter crystals, pulling crystalline boules or ribbons, cutting bulk crystals and mounting many small pieces onto panels. Accordingly, much effort has been given to making PV devices faster and cheaper, using large area teachniques: spraying, dipping, baking, etc. Unfortunately, many of these efforts have been marginal at best. Failure to establish large thin single crystals (or large grains) appears to be the main inadequacy. Coated surfaces tend to dry amorphously or in countless tiny crystals of random orientation. Whereas, we need a single thin crystal or at least several large grains in each PV cell. This is in order for sunlight released electrons to move in an orderly manner in the device. The idea is to make it energetically cheaper for sunlight freed electrons to move through an external electrical loop than through the semiconductor itself. Also, we want large numbers of electrons to be freed when sunlight hits the device. By themselves, intrinsic semiconductors, such as silicon Si, do not release enough electrons to be of interest. Si-Si bonds are strong and not broken sigfificantly by sunlight. Phosphorus (P), with its outer shell electron, is doped into silicon, about one atom per million. This provides ample free electrons, without so many that they short out in the device instead of going through the external electrical load. We also need to dope the crystal with atoms which have a relative deficiency of electrons in their outer shell. This is to provide so called "holes" into which electrons can migrate. Boron is usually doped into silicon in about the same ratio as phosphorus. The effect is like having positively charged particles in the electrical loop. When sunlight hits the surface, electrons ($e-$) and holes ($h+$) move in opposite directions. This creates a difference of potential or the equivalent of a battery in the loop, and current flows accordingly. This orderly movement of electrons and holes is better offered by a doped crystalline semiconductor than by amorphous material. Any large area production technique for making PV devices should endeavor to end up with this sort of final product. For related reasons, a PV cell should not be much larger than at present, namely a few centimeters per side. We want to produce many of these at once on a large sheet of copper substrate. We want to circumvent seeding, growing and cutting bulk crystals and affixing large numbers of individual parts to a panel. If we can accomplish these things, considerable time and costs may very well be saved. We want copper for a PV substrate because that metal works best with water or freon in conventional solar heated panels. We want to combine PV and regular solar thermal panels because about ninety percent of solar energy goes through PV cells as infrared heat anyway. We may as well heat something besides roof shingles with that energy.

SUMMARY OF THE INVENTION

This invention consists of a combination PV-solar heated panel. About 10% of the sunlight energy is taken off the top electrically; the balance goes through as infrared to a heat exchange fluid below. The invention includes a way to mass produce PV surfaces continuosly on a copper substrate without growing or cutting conventional boules or ribbons or mounting numerous small pieces onto panels.

BRIEF DESCRIPTION OF THE DRAWINGS

FIG. 3 also indicates how silicon may be bonded to copper.

DETAILED DESCRIPTION OF THE INVENTION

Figure 1:
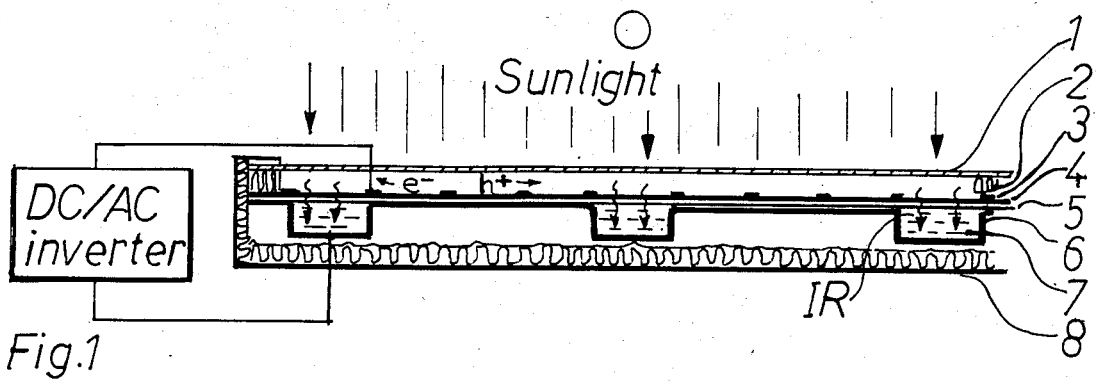
FIG. 1 is a cross section of the invented hybrid PV-solar panel.
Figure 2:
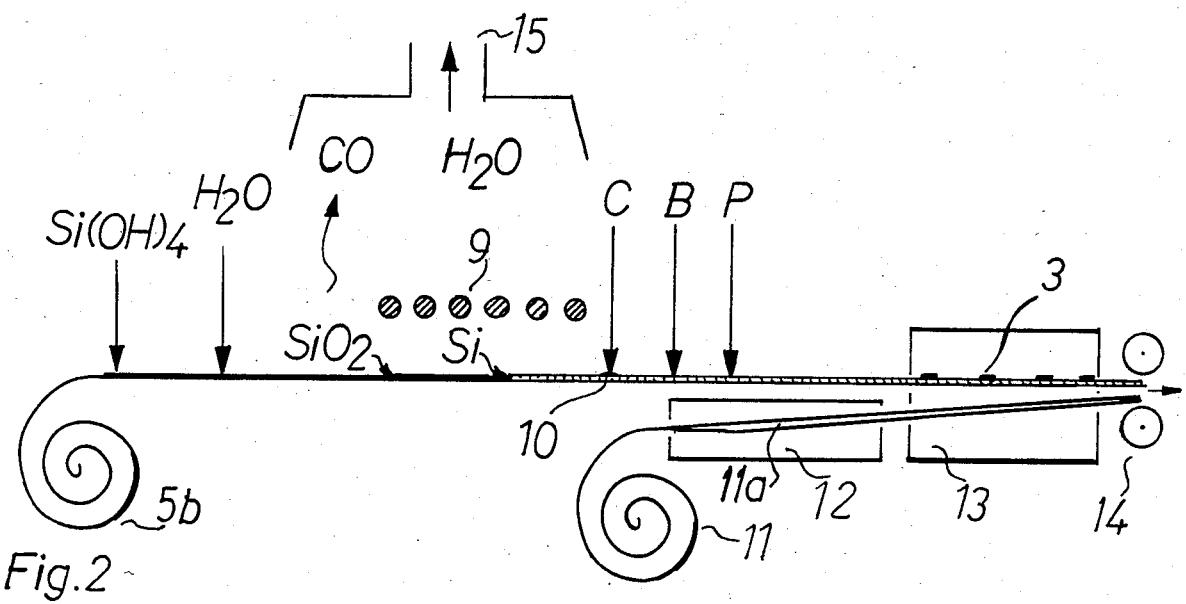
FIG. 2 shows a production line for making said panels.
Figure 3A:
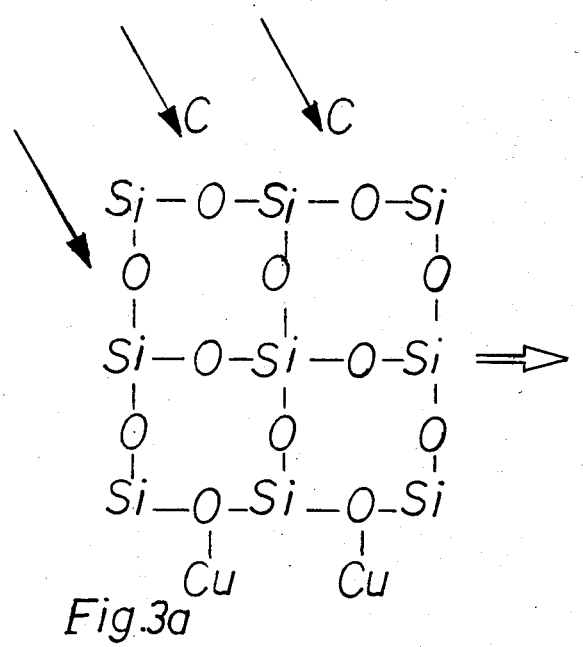
FIG. 3 indicates the transition of a crystal of silicon dioxide to one primarily of silicon as a function of impinging hot carbon ions.
Figure 3B:
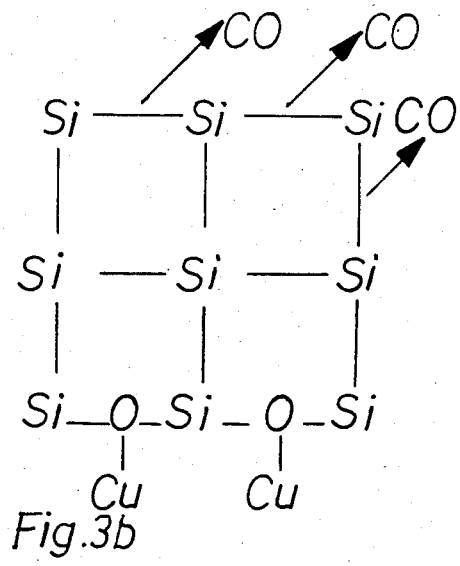

FIG. 2 shows how the panels of this invention are fabricated. Gelatinous silicic acid $Si(OH)_4$ is sprayed, brushed, or rolled onto a sheet of clean copper or copper with a thin coat of fresh copper oxide thereon. Then the gelatinous acid is washed with hot water or steam $H_2O$, then dried and ignited. The idea at this stage is to break down the silicic acid into its two constituents: silica $SiO_2$ (quartz) and water $H_2O$. Then we want to drive off the water and leave pure crystalline silica bonded to the copper substrate. There are other ways of putting glass onto a substrate, but usually glass contains metals unwanted for our purposes. Then, as the $SiO_2$ is formed, it is to be hit by energetic carbon atoms and ions from a combination of hot graphite rods (9, FIG. 2) and carbon ion accelerators (C, FIG. 2). The idea here is to drive out oxygen atoms O and leave pure crystalline silicon Si. This is done by forming carbon monoxide CO which is vented and burned off or chemically scrubbed by techniques discussed below. The equation is $SiO_2 + 2C = 2CO + Si$. Magnesium ions could also take out the oxygen, but they tend to leave the silicon amorphous. Surface tensions from Si-O and Si-Si bonds tend to crystalize the film. Additionally, the Si film may be zone refined by a high flux swath of energetic carbon ions from a carbon ion accelerator (10, FIG. 2). Pure silicon crystal is bonded to random grained copper by means of an interfacing layer of oxygen atoms which contribute partly to copper oxide and partly to silicon dioxide. See FIGS. 3a, 3b. These layers may be regulated during production by adjusting the times, concentrations and temperatures of the materials involved. Next, boron and phosphorus are baked or implanted into the silicon crystalline sheet by means of ovens or particle accelerators. Meanwhile, a conventional thermal panel is fabricated and soldered to the PV panel, as suggested by stations 12 and 13 of FIG. 2. Solder Station 13 also affixes electrical circuitry on the PV panel. FIG. 1 shows a cross section of the final panel. In use, the panel should produce about 100 watts peak power per square meter electrically and about 900 watts peak power per square meter thermally. As for fabrication supplies, silicic acid $Si(OH)_4$ can be produced (along with hydrofluosilicic acid, $H_2SiF_6$) by mixing water with silicon tetrofluoride SiF4, a fuming but incombustible gas. Ironically, the latter is made by etching glass with hydrofluoric acid HF. This may seen circular. But the idea is to eliminate unwanted metals which tend to collect in molten glass. The inventor has worked with these materials, and knows they can be handled safely, with due precautions. Their properties are discussed in part in many chemistry books but only completely (to this inventor's knowledge) in P. J. Durrant's *General and Inorganic Chemistry*, republished by John Wiley & Sons Inc., 1962, p412–415. A copy of this information is enclosed for the convenience of the Patent Examiner. This chemical information does not, however, show how to produce photovoltaic surfaces continuously on a copper substrate. That method comes from the inventor's experience in making semiconductor devices, his training as a physicist plus the inventive process itself which is difficult to define (but probably includes Murphy's law that nothing succeeds like dumb luck!). In operation, carbon monoxide may be dissolved readily in either an ammoniacal or a hydrochloric acid solution of cuprous chloride, resulting in the compound $CuCl,CO,2H_2O$. Or it may be burned in air, with a characteristic blue flame, resulting in innocuous carbon dioxide. Which is to say, the invented procedure for making PV surfaces can indeed be kept safe.

In more detail, FIG. 1 consists of the following components: Glazing 1 (preferably clear tempered glass), Insulation-spacer 2 (to provide a layer of dead air between the often cold glazing and the energy absorber plate), Solder Lines 3, Crystalline Silicon 4 (Si), Copper Substrate 5 (Cu), Embossed Tubes 6, Heat Exchange Fluid 7 (water or freon), Insulated Casing 8. Infrared heat IR is indicated going through the PV panel into the heat exchange fluid below. Sun-released electrons $e^-$ are shown migrating in one direction, holes $H^{30}$ in the other. Direct current is rendered alternating by a conventional DC/AC inverter.

FIG. 2 illustrates Sheet Copper Roll 5$b$, Silicic Acid $Si(OH)_4$, Hot Water or Steam $H_2O$, Hot Graphite Rods 9, Silica Film $SiO_2$, Silicon Crystalline Film Si, Carbon Monoxide CO vented to CO Scrubber 15, Carbon Ion Accelerator C, Zone Refined Strip 10, Boron Implanter B, Phosphorus Implanter P, Sheet Copper Roll 11, Embossed Tube 11$a$, Embosser 12, Solder Station 13, Conveyor 14.

FIG. 3$a$ indicates the crystalline structure of silica $SiO_2$, its bonding to Copper Substrate Cu by Oxygen Atoms O. FIG. 3$b$ indicates a predominantly pure Silicon Si crystal after Carbon Atoms or Ions C have removed most of the crystal's oxygen by forming carbon monoxide.

The inventor claims:

1. An integrated photovoltaic-thermal panel comprising a layer of crystalline silicon made in part by reduction of silicic acid by hot carbon atoms and having a p-n junction therein, on a substrate of oxidized copper.

2. A process for production of integrated photovoltaic-thermal panels, the preferred process including the following chemical vapor depositions, in air, and the following work stations:

(a) copper oxide station, whereby sheet copper, Cu, is cleaned and a layer of copper oxide, CuO, is formed thereon by heating said copper in air or steam, (b) silica station, whereby silicic acid, $Si(OH)_4$, and steam, $H_2O$, are sprayed on said hot oxidized sheets of copper, and $Si(OH)_4$ is reduced by hot carbon atoms to carbon monoxide, CO, which is vented and burned off, and silica, $SiO_2$, a layer of which is deposited onto and bonded thermally to said copper oxide layer, (c) silicon station, whereby said silicic acid is further reduced by increased numbers of hot carbon atoms to silicon, Si, a layer of which is deposited on and bonded to said $SiO_2$ layer, (d) p-n junction station, whereby boron atoms, then phosphorus atoms, are diffused into said silicon layer, under temperature, timing and number density controls, to establish what is called a p-n junction, (e) crystallization station, whereby heat is applied to the surface of said doped silicon layer, to sinter same and to let silicon atoms form bonds with one another in an orderly and crystalline manner and dominate over unordered, amorphous, bonds of oxide layers below, the results being a crystalline photovoltaic, PV, surface layer bonded to a silica layer and that to CuO and that to Cu, (f) electrode grid station, whereby electrical lead-wires are affixed in series and in parallel to said PV surfaces, (g) thermal exchanger station, whereby flat tubes are soldered to the underside of said copper substrate, to carry a heat exchange fluid to and away from said PV layer, to cool said PV layer and to extract thermal heat as well as electrical energy from said integrated PV-thermal panel.

* * * * *